United States Patent [19]

Kroymann

[11] 4,411,536

[45] Oct. 25, 1983

[54] BI-DIRECTIONAL TEMPERATURE EXCURSION SENSING AND LOCATING APPARATUS

[75] Inventor: Howard B. Kroymann, Menlo Park, Calif.

[73] Assignee: Raychem Corporation, Menlo Park, Calif.

[21] Appl. No.: 269,933

[22] Filed: May 29, 1981

[51] Int. Cl.³ .................. G01K 13/00; G01R 31/08
[52] U.S. Cl. .................. 374/184; 174/138 R; 324/52; 340/594; 374/111
[58] Field of Search ........... 374/114, 163, 184, 111; 361/282; 340/594, 593, 524; 174/138 R, 139

[56] References Cited

U.S. PATENT DOCUMENTS

| | | | |
|---|---|---|---|
| 2,611,805 | 9/1952 | Osborn et al. | 324/52 |
| 2,615,973 | 10/1952 | Heath, Jr. | 374/111 X |
| 2,814,774 | 11/1957 | Wong | 324/51 |
| 3,248,646 | 4/1966 | Brazee | 324/52 |
| 3,284,704 | 11/1966 | Lamont | 374/111 X |
| 3,753,373 | 8/1973 | Brown | 324/61 R |
| 3,759,104 | 9/1973 | Robinson | 361/282 X |
| 3,786,461 | 1/1974 | Jamison | 340/594 X |
| 3,950,746 | 4/1976 | Davies | 340/596 X |
| 3,999,175 | 12/1976 | Thibodeau | 340/596 |
| 4,103,225 | 7/1978 | Stephens | 374/111 X |

FOREIGN PATENT DOCUMENTS 653864 5/1951 United Kingdom ........... 374/111

*Primary Examiner*—Daniel M. Yasich
*Attorney, Agent, or Firm*—James W. Peterson

[57] ABSTRACT

A temperature increase or excursion sensor and locator consisting of a temperature sensitive cable which includes three electrical conductors, two conductors are separated by a dielectric member to form a linear strip capacitor and one of the two conductors has a number of thermostatic devices connected serially. Over or under temperature excursions are sensed and located by the cable when it is connected to control electronics by detecting the continuity and by measuring the capacitance of the cable. Under normal conditions, all of the thermostatic devices are electrically conducting and the control electronics measures the full capacitance from both ends of the cable and detects continuity over the full length of the cable. Upon a temperature increase or an excursion, one or more thermostatic devices become non-conductive, creating a discontinuity in one of the conductors and in addition the resulting capacitance is proportionately reduced. Presence of the temperature excursions is detected by the control electronics which senses a loss in continuity in one of the conductors. The presence and location of the excursions are also indicated by the control electronics which from each end compares and ratios the reduced capacitance to the full cable capacitance. The respective ratios of said capacitances determine the distance of the temperature excursions from each end of the cable.

2 Claims, 1 Drawing Figure

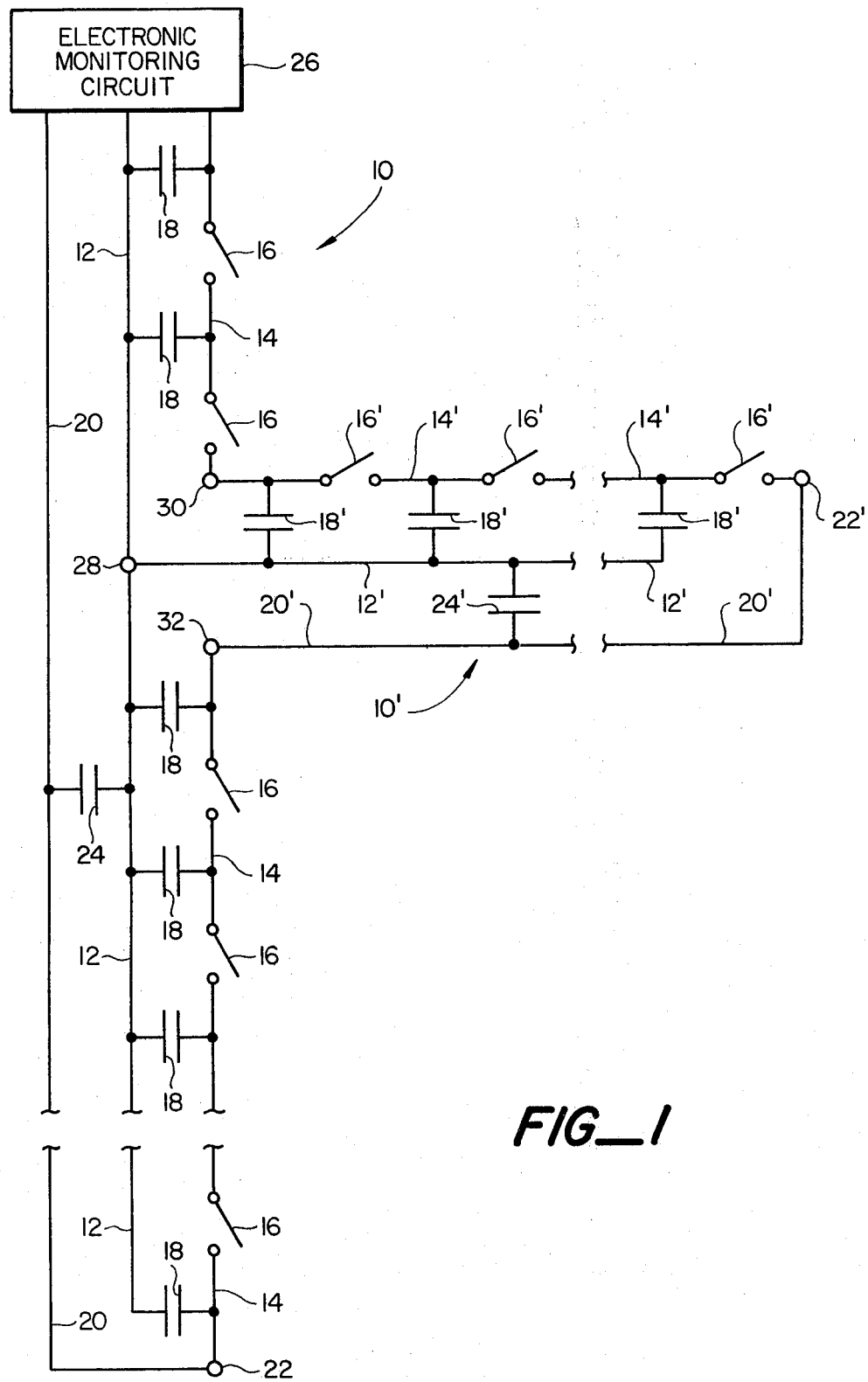
FIG_1

BI-DIRECTIONAL TEMPERATURE EXCURSION SENSING AND LOCATING APPARATUS

BACKGROUND OF THE INVENTION

Over temperature and under temperature detection are important for the protection of personnel, equipment, and agricultural crops. Electronic equipment will fail if allowed to exceed specified maximum and minimum temperatures. Incipient mechanical equipment failure can be detected by sensing overheating and shutting down the equipment. Ammunition dumps, power cables, coal conveyors, etc. must all be operated below maximum temperature levels to avoid damage. Agricultural crops must be kept from freezing to survive. Certain chemical processes and fluid transport pipes must be kept at temperatures well above ambient to avoid adverse chemical reactions or increased viscosity. These are but a few examples of extended or spatially distributed systems where knowledge of undesirable temperature excursions is essential.

Heating and cooling systems are often provided to avoid undersirable temperature excursions. Such systems, however, are generally energy intensive, and, with the advent of the energy crisis, expensive to operate. Furthermore, heating and cooling systems are often operated when they are not needed due to the lack of over- or under-temperature information. Finally, such systems often fail without warning and without any indication to the user, resulting in undesirable temperature excursions which often lead to catastrophic failures and safety hazards.

Temperature excursions are conventionally measured by a number of devices which change a physical property with temperature. Perhaps the simplest device is the thermostatic switch or thermostat which either opens or closes an electrical circuit when the temperature rises above or falls below a predetermined value. The thermostat is a discrete device but has been used to monitor extended or spatially distributed systems for temperature excursions through the use of multiplexing or by running individual wires to each of the thermostats. Multiplexing requires an electronic circuit and electrical power at the location of each thermostat to encode the information for transmission. The use of individual wires produces a heavy, inflexible, expensive, and generally impractical cable when large numbers of thermostats are required.

The instant invention improves over the above described techniques by providing a light, flexible cable containing only three conductors and thermostatic devices distributed along the length of the cable. Multiplexing circuits and individual wires are no longer necessary to detect and locate temperature excursions.

Commonly assigned U.S. patent application Ser. No. 229,913, now U.S. Pat. No. 4,372,693 discloses a temperature excursion and sensing device. The instant invention is an improvement to U.S. patent application Ser. No. 229,913, now U.S. Pat. No. 4,372,693 which is incorporated herein by reference wherein the improvement comprises the inclusion of a third conductor permitting a positive alarm/no alarm detection method independent of capacitance measurements, bi-directional sensing and branched configurations of sensing cable. Specifically, the third conductor permits the sensing of more than one temperature excursion by measuring from both ends of the cable and also permits branched circuits.

OBJECTS OF THE INVENTION

A primary object of the instant invention is to provide a sensor cable for detecting temperature excursions and determining the distance of said excursions from each end of the cable.

Another object of the instant invention is to provide a sensing cable which has integral positive excursion detection means.

Yet another object of the instant invention is to provide a multi-branched sensing and locating cable.

A further object of the instant invention is to provide a cable which can monitor the size of a temperature excursion.

SUMMARY OF THE INVENTION

The purpose of the instant invention is to detect and locate temperature excursions from a predetermined temperature. To accomplish this purpose, the invention provides a sensing cable and complementary electronics wherein the sensing cable comprises three electrical conductors running the full length of the cable wherein the second of the electrical conductors is comprised of a plurality of serially connected thermostatic devices distributed along the length of the cable, and a dielectric member such as insulation between said conductor and the first of the electrical conductors to form a linear strip capacitor. The third electrical conductor is interconnected to the second electrical conductor at the far end of the cable. The thermostatic devices are chosen so that they are electrically conducting when the temperature is in the normal range but electrically insulating when a temperature excursion occurs. The cable capacitance is periodically measured and the electrical continuity of the second electrical conductor is periodically checked by the complementary electronics at one end of the cable. Under normal conditions, the second electrical conductor is electrically continuous, the full cable capacitance is measured and the full cable length is displayed by the electronics. Upon encountering a temperature excursion, the cable capacitance is reduced in proportion to the distance along the cable to the insulating thermostatic device which has been triggered and the conductor becomes electrically discontinuous. This change from continuity to discontinuity is used to positively determine that an excursion has occured. The complementary electronics compares the full cable capacitance and the reduced capacitance arriving at a ratio which determines the location of the predetermined temperature excursion. When the temperature returns to normal, the open thermostatic device recloses, the conductor becomes electrically continuous, and the full cable capacitance is measured once again. The capacitance measurement is made in one direction by use of the first and second conductors and in the opposite direction by the use of the second and third conductors.

DESCRIPTION OF THE DRAWINGS

The FIGURE illustrates the equivalent circuit of the sensing cable of the instant invention.

DETAILED DESCRIPTION OF THE INVENTION

With reference to the drawing, the FIGURE illustrates in schematic form the cable of the instant invention generally noted at 10 including a branch from said capable generally denoted by the numeral 10'. Branch 10' is identical in construction to cable 10. For the purpose of clarity, cable 10 will be described in detail with the understanding that identical components are contained in branch 10' and have accordingly been labelled with "'" notation.

The cable of the instant invention comprises: a first electrical conductor 12; a second electrical conductor 14 including a plurality of thermostatic devices 16; a dielectric member 18 which is illustrated as a plurality of capacitors which interconnect the first and second electrical connectors 12 and 14; and a third electrical conductor 20 which is connected to the far or second end of the second electrical conductor 14 at shorting termination 22.

The third electrical conductor 20 is insulated from the first electrical conductor 12 by a dielectric insulation 24.

The dielectric member 18 which is disposed between the first electrical conductor 12 and the second electrical conductor 14 may in fact be comprised of discrete capacitors, as schematically shown, or may be comprised of a distributed capacitance between the said two conductors. Dielectric insulation 24 on the other hand is a distributed capacitance between first electrical conductor 12 and third electrical conductor 20. Dielectric member 18 is chosen to contribute at least 1,000 times as much capacitance per unit of length of the cable between the first and second electrical conductors 12 and 14 as is contributed by dielectric insulation 24 between the first and third electrical conductors 12 and 20.

Thermostatic sensors 16 are preferably thermostats which are closed during normal operation and are open during a temperature excursion at the appropriate location.

To sense and locate temperature excursions in extended or spatially distributed systems, a suitable cable such as cable 10 described above is connected to an electronic monitoring circuit 26. The first temperature excursion located at a thermostatic device 16 or 16' will cause the respective thermostatic device to open. The electronic monitoring circuit 26 detects this event by detecting a sudden and complete loss in electrical continuity between the second electrical conductor 14 and the third electrical conductor 20. This loss in electrical continuity is no less pronounced if the excursion occurs at the far or second end of the second electrical conductor 14 than at the monitored or first end of the second electrical conductor 14, thereby permitting the detection of the first temperature excursion even when it occurs at the far or second end of a long second electrical conductor 14. This capability is a dramatic improvement as compared to the invention disclosed in U.S. patent application Ser. No. 229,913, now U.S. Pat. No. 4,372,693. Specifically, the device disclosed in the aforementioned Patent Application requires a measurable change in cable capacitance to detect existence of the excursion. An excursion that occurs a small distance from the far or second end of the second electrical conductor 14 will reduce the measured capacitance by such a minute amount as to be virtually undetectable by the device disclosed in the aforementioned Patent Application. The above described positive detection aspect of the instant invention is independent of the discussion which follows regarding location of temperature excursions.

In the device disclosed in U.S. patent application Ser. No. 229,913, now U.S. Pat. No. 4,372,693, the capacitance as measured between the monitored or first end of the second electrical conductor 14 and the first end of the first electrical conductor 12, when compared to the full cable capacitance determines the distance between the monitored or first end of the second electrical conductor 14 and the temperature excursion. It can be appreciated that if the excursion occurs one quarter of the way down the second electrical conductor 14, then the measured capacitance will be 25% of the full cable capacitance, thereby indicating that the excursion is located one quarter of the way from the monitored or first end of the second electrical conductor 14. It should be apparent that this approach to detection is limited to the leading edge of the temperature excursion, i.e., the point closest to the monitored or first end of the second electrical conductor 14. In this regard, the device will be blind beyond the first thermostatic device 16 or 6' which has opened due to the excursion. The trailing edge of the excursion and any other excursions farther down the cable will go unnoticed. The instant invention is an improvement over the above-mentioned device, in that it provides for bi-directional excursion sensing.

The instant invention will locate the trailing edge of the temperature excursion and if a second temperature excursion should occur further down the cable, then the instant invention will detect and simultaneously locate the trailing edge of that second temperature excursion. This is possible because the electronic monitoring circuit 26 alternately measures the capacitance between the first and second electrical conductors 12 and 14 and the capacitance between the first and third electrical conductors 12 and 20. Due to the interconnection of the third electrical conductor 20 at the far or second end of the second electrical conductor 14 at shorting termination 22, and due to the fact that the voltage potential is the same at the first and second ends of the first electrical conductor 12, the capacitance measured at the first end of the first and third electrical conductors 12 and 20 is, in effect, the capacitance that could be measured between the first and second electrical conductors 12 and 14 at their far or second ends. The instant invention is therefore a bi-directional temperature excursion sensing and locating apparatus which will report the distance of the nearest and farthest temperature excursions from the first and second ends respectively of the second electrical conductor 14.

The instant invention's sensing from both ends of the cable allows verification of one temperature excursion, monitoring of the size of one temperature excursion, and detection and location of two temperature excursions. If the temperature excursion were pin-point in nature, thus being only one thermostatic device 16 or 16', then the exact location of the temperature excursion could be verified. If as in the example above the temperature excursion occurred at a point one quarter of the way down the length of the cable, then the electronic monitoring circuit 26 would measure 25% of original capacitance between first and second electrical conductors 12 and 14 and would measure 75% of the original capacitance between the first and third electrical conductors 12 and 20. Should the temperature excursion change or grow in size, say with reference to the above mentioned example, then the measured capacitances would likewise change. If for example, the temperature excursion grew in size, the above-mentioned capacitance measurments might be 20% and 50%, respectively, indicating that the leading edge of the temperature excursion started at a point two tenths of the way down the second electrical conductor 14 and extended to a point one half the way down the second electrical conductor 14. It can likewise be seen that the apparatus of the instant invention will detect two separate temperature excursions.

It is important to clarify that electronic monitoring circuit 26 has two separate capablities. The first of these capabilities is that of testing the continuity between the first end of the second electrical conductor 14 and the first end of the third electrical conductor 20. Suitable resistance measuring circuits well-known to those skilled in the art may be utilized which will trigger an alarm noting that a temperature excursion has occurred. The second capability of the electronic monitoring circuit 26 is that of locating the position of the temperature excursion. In this regard, the instant invention utilizes the capacitance measuring circuitry disclosed in U.S. patent application Ser. No. 229,913, which has been incorporated herein by reference. As discussed above, electronic monitoring circuit 26 alternately measures the original and reduced capacitance values of the first and second electrical conductors 12 and 14 and the original and reduced capacitance values of the second and third electrical conductors 14 and 20. The ratio of the respective original and reduced capacitance values being directly proportional to the distance of the temperature excursion from the first end of the second electrical conductor 14 or alternately from the second end of the second electrical conductor 14.

An important aspect of the instant invention is the ability to provide a cable which is spatially distributed, i.e., branched. As mentioned previously, branch 10' is identical in construction to cable 10. The various components of branch 10' perform identically to those described with respect to cable 10 and any number of branches 10' may be connected to cable 10 or to any other branches. The first branch electrical conductor 12' is connected to first electrical conductor 12 at junction 28. The second branch electrical conductor 14' is connected to second electrical conductor 14 at junction 30. The third branch electrical conductor 20' is connected one end to second electrical conductor 14 at junction 32 and at the other end to second branch electrical connector 14' at branch shorting termination 22'. The third branch electrical conductor 20' interconnects the thermostatic devices 16 in cable 10 and the branch thermostatic devices 16' in branch 10' in serial fashion, as can be seen in the FIGURE. This fact, in combination with the fact that the full length of the first conductor 12 and the first branch conductor 12' are at the same electrical potential allows interconnection of branched sensor cables. The electronic monitoring circuit 26 views the branched sensing cable as a single-line three conductor cable, and detects and locates temperature excursions as described above. Through appropriate schematic diagramming of the sensor branch network, the excursion locations reported by the electronic monitoring circuit 26 can be translated into the correct location on the branch network.

It can be appreciated that the inclusion of the third electrical conductor 20 and the third branch electrical conductor 20' is a significant improvement over the above discussed U.S. patent application Ser. No. 229,913, now U.S. Pat. No. 4,372,693, in that it permits a positive alarm/no alarm detection method independent of capacitance measurements, it permits bi-directional sensing, i.e., from opposite ends of the cable, and it permits branched configurations of the sensing cable.

From the foregoing detailed description, it is evident that there are a number of changes, adaptations, and modifications of the present invention which come within the province of those skilled in the art. However, it is intended that all such variations not departing from the spirit of the invention, will be considered as within the scope thereof as limited solely by the appended claims.

What is claimed is:

1. Temperature excursion sensing and locating apparatus, comprising:
a first electrical conductor in a cable;
a second electrical conductor in said cable comprising a plurality of serially connected, normally conductive, thermostatic devices for detecting temperature excursions, said second electrical conductor thereby having first end and a second end, each of the thermostatic devices becoming non-conductive upon detection of a predetermined temperature excursion;
a dielectric member disposed between first and second electrical conductors, said first and second electrical conductors and dielectric member having an original capacitance value while the thermostatic devices are conductive and a reduced capacitance value upon detection of the predetermined temperature excursion by an opening of a thermostatic device in response to said temperature excursion a first end of said first electrical conductor and the first end of said second electrical conductor selectively connectable to a capacitance measuring device which compares the original and reduced capacitance values to determine the presence of a said predetermined temperature excursion and its distance from the first end of said second electrical conductor; and a third electrical conductor in said cable and having first and second ends, said second end connected to the second end of said second electrical conductor, the first end of said third electrical conductor and the first end of said first electrical conductor being alternately connectable to a capacitance measuring device which compares the original and reduced capacitance values to determine the presence of a predetermined temperature excursion and its distance from the second end of said second electrical conductor, the first end of said third electrical conductor and the first end of said second electrical conductor forming a continuous circuit before said excursion and a discontinuous circuit during said excursions defining a positive temperature excursion detection means independent of capacitance measurement.

2. The apparatus as set forth in claim 1 wherein the dielectric member comprises a plurality of discrete capacitors electrically connected in parallel which electrically interconnect the first and second electrical conductors.

* * * * *